United States Patent
Ryu

(10) Patent No.: US 7,651,878 B2
(45) Date of Patent: Jan. 26, 2010

(54) WAFER-LEVEL CHIP-SCALE PACKAGE OF IMAGE SENSOR AND METHOD OF MANUFACTURING THE SAME

(75) Inventor: Jin Mun Ryu, Yongin (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 458 days.

(21) Appl. No.: 11/525,925

(22) Filed: Sep. 25, 2006

(65) Prior Publication Data

US 2007/0080418 A1    Apr. 12, 2007

(30) Foreign Application Priority Data

Oct. 10, 2005    (KR) ............... 10-2005-0094819

(51) Int. Cl.
*H01L 21/00*    (2006.01)
(52) U.S. Cl. ............... 438/25; 438/26; 257/E33.059
(58) Field of Classification Search ............... 438/25, 438/26; 257/E33.059, 21.001
See application file for complete search history.

(56) References Cited

U.S. PATENT DOCUMENTS 7,419,839 B2 *  9/2008  Camras et al. ............... 438/22
7,419,842 B2 *  9/2008  Auch et al. ............... 438/26

FOREIGN PATENT DOCUMENTS

| | | |
|---|---|---|
| JP | 2003-116066 | 4/2003 |
| JP | 2004-88082 | 3/2004 |
| JP | 2004-207461 | 7/2004 |
| JP | 2005-203752 | 7/2005 |
| KR | 10-0244580 | 11/1999 |
| KR | 2002-0074158 | 9/2002 |
| KR | 10-2004-0040404 | 5/2004 |
| WO | WO 01/43181 | 6/2001 |
| WO | WO 02/51217 | 6/2002 |

* cited by examiner

Primary Examiner—David S Blum

(57) ABSTRACT

Provided are a WLCSP of an image sensor and a method of manufacturing the same. The WLCSP includes a wafer, support members, glass, and metal bumps. The wafer has an image sensor and a pair of pads disposed thereon, a portion of the bottom surface of the image sensor being exposed outward from the both ends of the wafer. The support members are disposed on the pads to support the both bottom sides of the glass, the support members being formed to a predetermined thickness to provide a space for forming an air cavity. The glass is safely seated on the support members such that the air cavity is formed on the wafer. The metal bumps are disposed on the both sides of the wafer corresponding to the pads such that the bottom surfaces of the metal bumps protrude beyond the bottom surface of the wafer and form conductive lines electrically connected to the pads. Therefore, the package can be directly attached to a camera module even without using a separate PCB or ceramic substrate. Accordingly, the module assembly space can be reduced to miniaturize the product. Also, the substrate manufacturing costs can be reduced to lower the unit price of the product.

8 Claims, 5 Drawing Sheets

[FIG. 1]
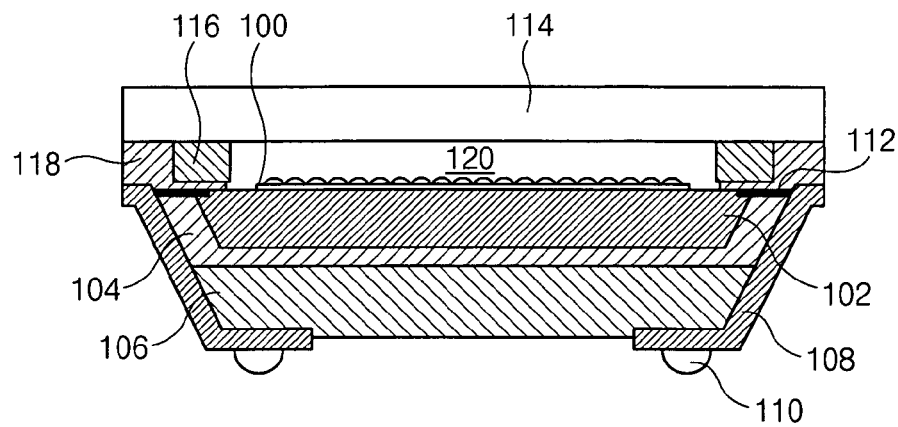
[FIG. 2]
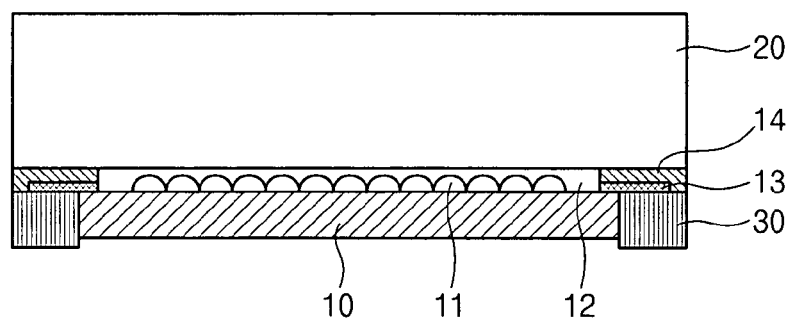
[FIG. 3]
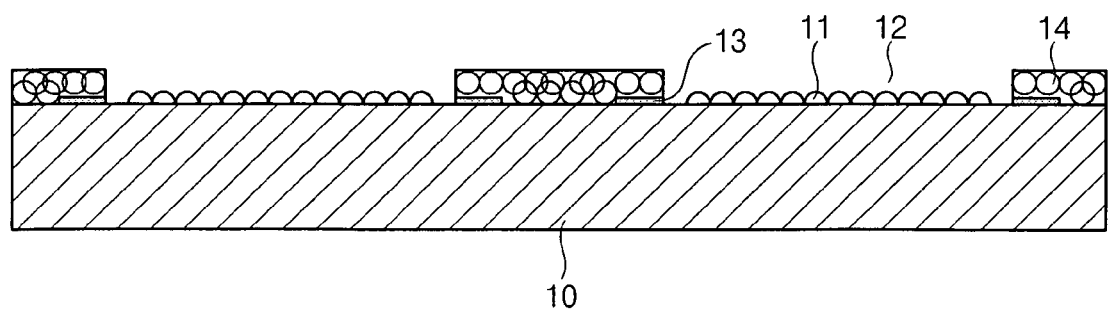

[FIG. 4]
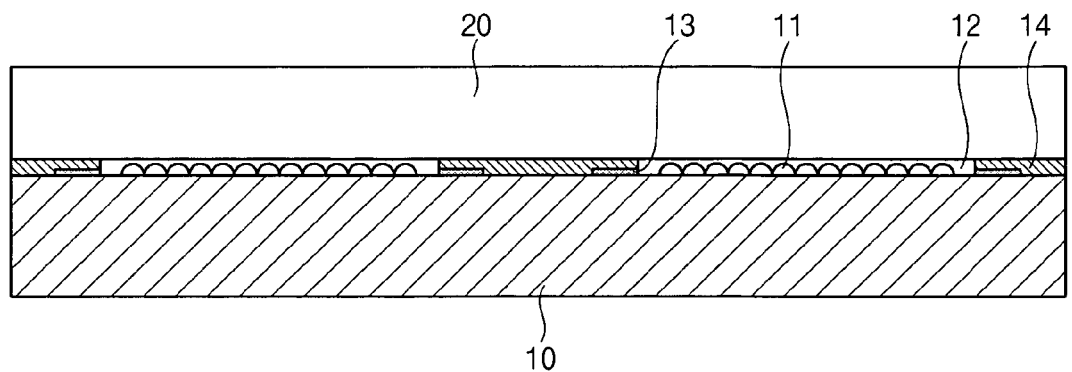
[FIG. 5]
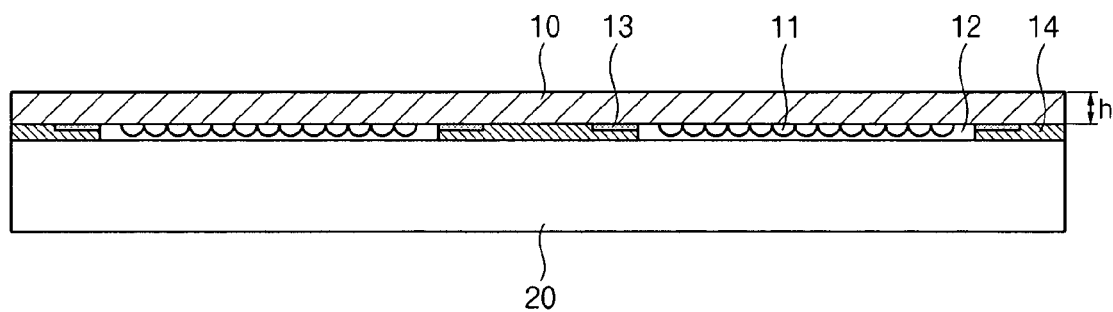
[FIG. 6A]
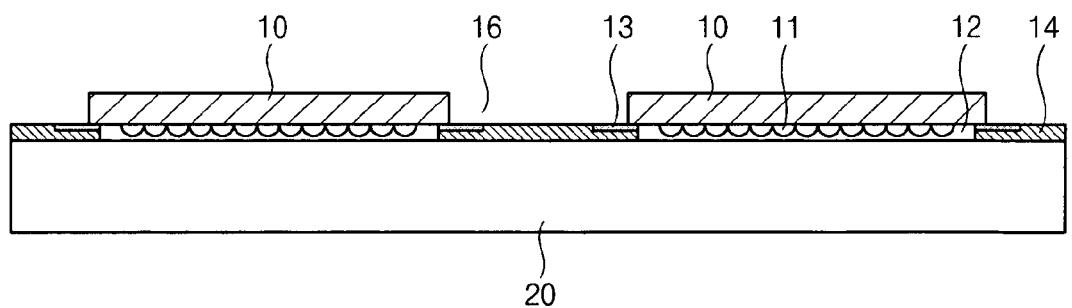
[FIG. 6B]
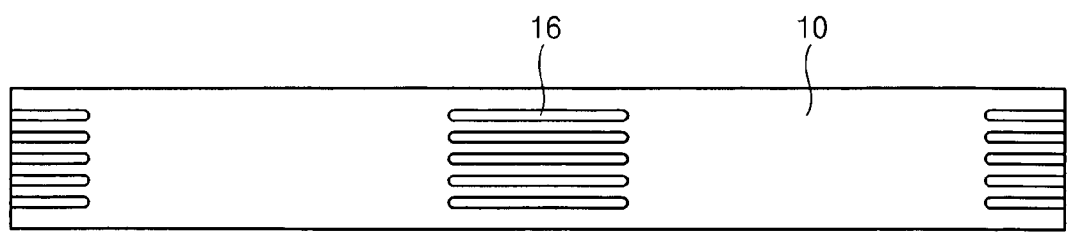

[FIG. 7A]
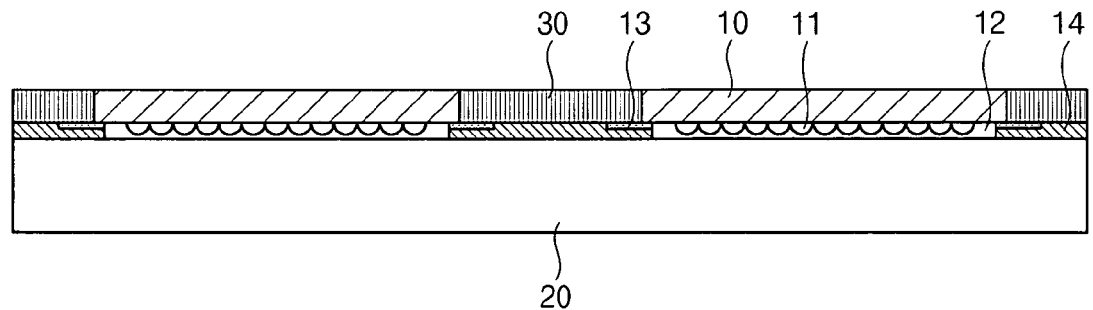
[FIG. 7B]
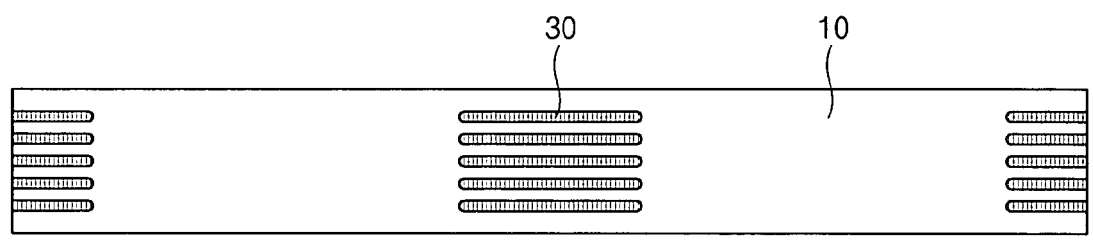
[FIG. 8A]
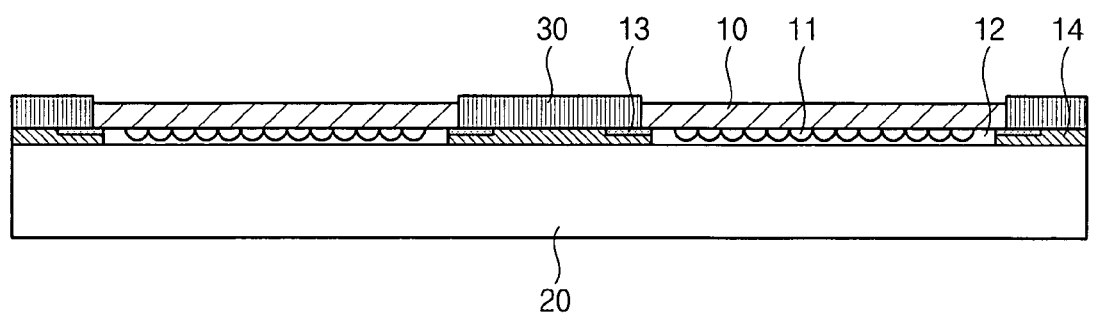
[FIG. 8B]
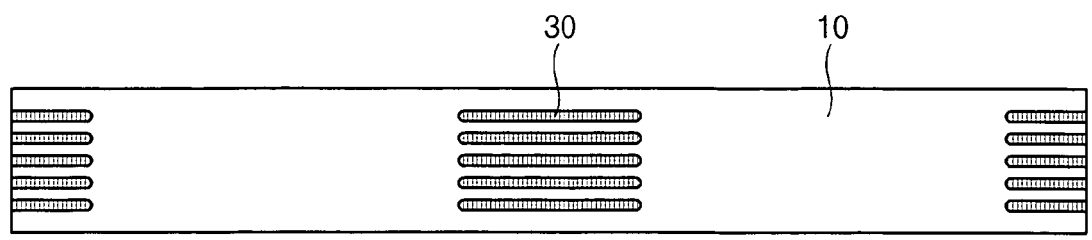

[FIG. 9A]
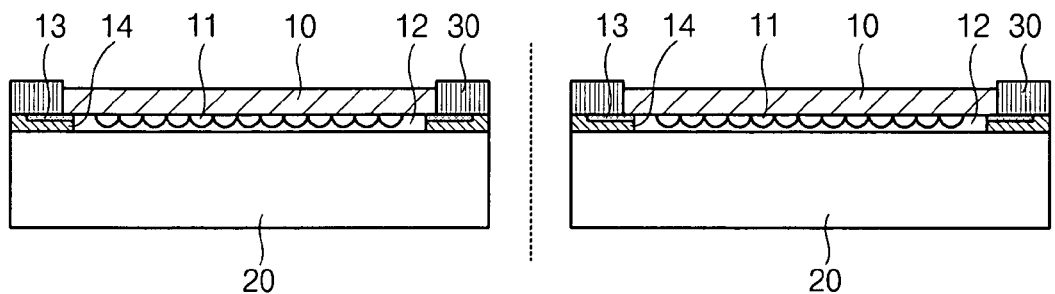
[FIG. 9B]
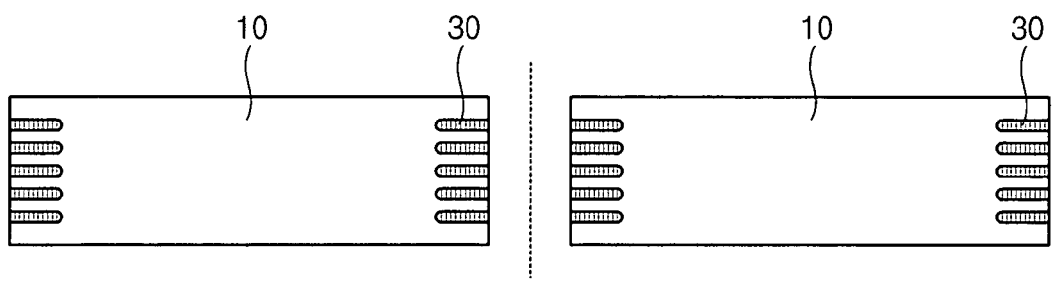
[FIG. 10A]
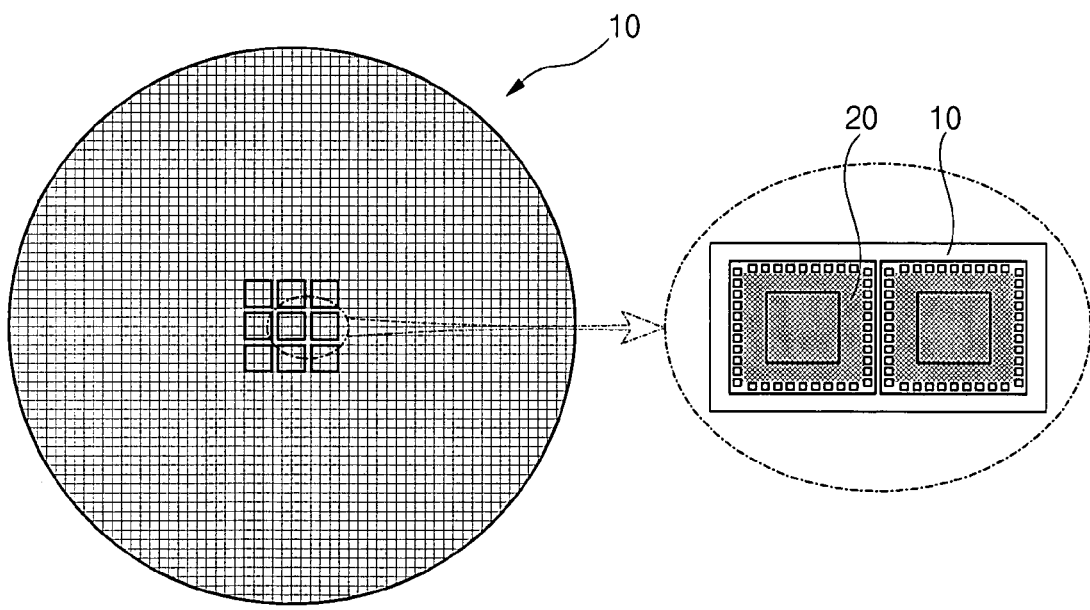

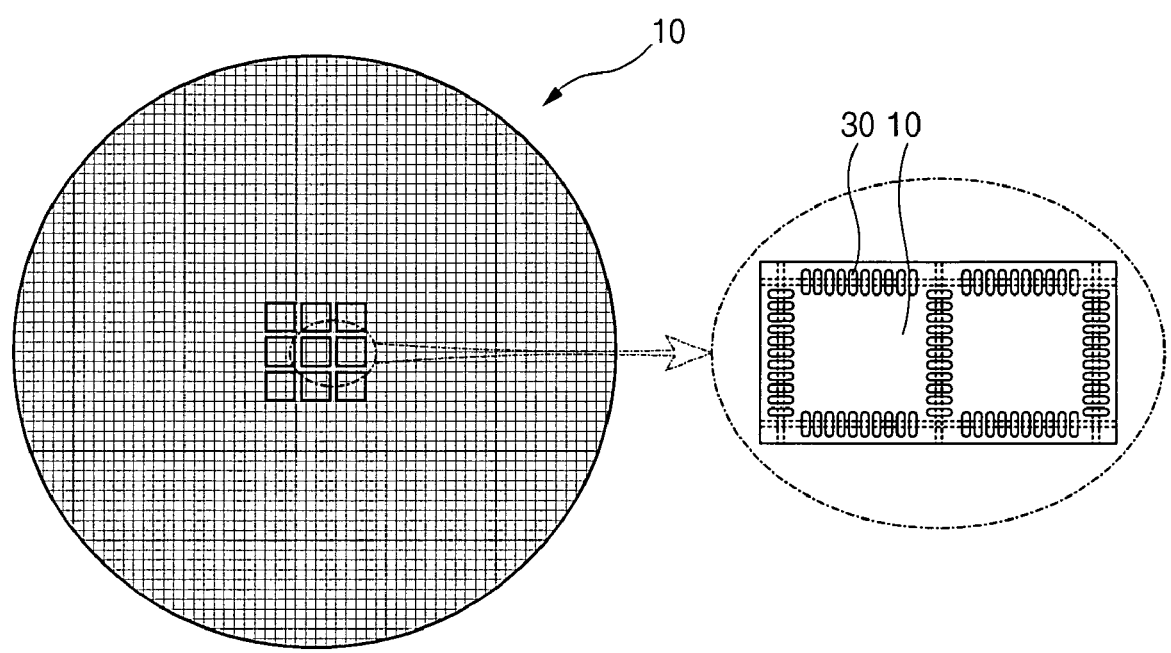
[FIG. 10B]

WAFER-LEVEL CHIP-SCALE PACKAGE OF IMAGE SENSOR AND METHOD OF MANUFACTURING THE SAME

CROSS-REFERENCE TO RELATED APPLICATIONS

This application claims the benefit of Korean Patent Application No. 2005-94819 filed with the Korea Industrial Property Office on Oct. 10, 2005, the disclosure of which is incorporated herein by reference.

BACKGROUND OF THE INVENTION

1. Field of the Invention

The present invention relates to a wafer-level chip-scale package of an image sensor and a method of manufacturing the same. In the method, a glass is attached in a wafer level stage such that metal bumps are formed as external connection terminals. After the wafer is thinned, long via holes are formed by dry etching and are filled with metal. Therefore, conventional solder balls can be omitted. Accordingly, it is possible to shorten the manufacturing process, enhance the mass-production capability and minimize the defects due to foreign substances.

2. Description of the Related Art

One of the main trends of semiconductor industries is miniaturization of semiconductor devices. The demand for the miniaturization is stronger in a semiconductor chip package industry. The package is formed by sealing an integrated circuit (IC) chip using plastic or ceramic resin so that the IC chip can be installed in an actual electronic device.

A conventional typical package is much large than an IC chip installed therein. Accordingly, package engineers have attempted to reduce a package size to about a chip size.

Owing to the above attempts, a chip-scale package (CSP) and a wafer-level chip-scale package (WLCSP) have been recently developed. The chip-scale package is also call "chip-size package". In a conventional package manufacturing method, package assembly is performed on a separate package basis. On the other hand, in the WLCSP method, a plurality of packages are simultaneously assembled and manufactured in a wafer level.

Development of semiconductor IC chips has contributed to development of package technologies, leading to the high-density, high-speed, miniaturization and slimness of the package. The structure of a package device has evolved from a pin insert type or a through hole mount type to a surface mount type, thereby increasing the mount density for a circuit board. Recently, researches are actively conducted on a chip-size package that can reduce a package size to about a chip size while maintaining bare chip characteristics in a package state.

A WLCSP is one of chip-size packages. In the WLCSP, chip pads are rerouted or redistributed on a chip surface and then solder balls are formed. In the WLCSP, a chip or a die is directly mounted on a circuit board by using a flip-chip method, and solder balls formed on the redistributed circuit of the chip are bonded to conductive pads of the circuit board. At this point, solder balls are also formed on the conductive pads and are thus bonded to the solder balls of the package.

Recently, there have been introduced a variety of CSP technologies that can reduce a package size to about a semiconductor chip size. These technologies are rapidly spread thanks to the miniaturization and high-integration of semiconductor devices.

A wafer-level package (WLP) technology is esteemed as the next-generation CSP technology. In the WLP technology, the entire assembly process is completed in a wafer level where chips are not diced. In the WLP technology, a series of assembly processes, such as die bonding, wire bonding, and molding, are completed in a wafer state where a plurality of chips are connected to one another, and then the resulting structure is diced to manufacture the complete products.

Therefore, compared to the CSP technology, the WLP technology can further reduce the total package costs.

In general, solder balls are formed on an active side of a semiconductor chip in the WLCSP. This structure makes it difficult to stack the WLCSP or to apply the WLCSP to manufacture of a sensor package such as a charge coupled device (CCD).

A conventional packaged IC device, which includes an image sensor package manufactured using the WLCSP technology, is disclosed in Korean Patent Publication No. 2002-74158. The structure of the conventional packaged IC device will be briefly described with reference to FIG. 1.

FIG. 1 illustrates a conventional crystal substrate device with an internal cavity.

Referring to FIG. 1, a microlens array 100 is formed on the top surface of a crystal substrate 102. A package layer 106, which is generally formed of glass, is hermetically attached onto the bottom surface of the crystal substrate 102 by an epoxy 104. An electrical contact 108 is formed along each edge of the package layer 106. A solder ball bump 110 is formed on the bottom surface of the package layer 106, and a conductive pad 112 is formed on the top surface of the crystal substrate 102. The electrical contact 108 is connected to the solder ball bump 110 and is electrically connected to the conductive pad 112.

A package layer 114, which is generally formed of glass, and an associated spacer member 116 are hermetically attached onto the top of the crystal substrate 102 by an adhesive such as an epoxy 108 such that a cavity 120 is formed between the microlens array 100 and the package layer 114.

The electrical contact 108 is formed, for example by plating, on the slant surfaces of the epoxy 104 and the package layer 106.

Because the conductive pad 112 and the electrical contact 108 face and contact each other, the conventional IC is low in connection reliability. Also, because the conventional IC is manufactured by stacking a plurality of components, the structure thereof becomes complex, and the manufacturing process becomes complicated.

Conventional semiconductor devices with a high-reliability ball grid array (BGA) formed using the SLCSP technology are disclosed in International Patent Publication No. WO 99/040624, Korean Patent Publication No. 2000-2962, and Korean Patent Publication No. 2002-49940. In the conventional semiconductor devices, a solder bump is formed to have a solder ball electrically connected to a pad electrode. Many processes are required to manufacture the solder ball, and the processes are complex. This degrades the mass-production capability and the production of the devices.

Moreover, the conventional WLCSP should have such a structure that a plurality of solder balls are formed to protrude from the bottom of the WLCSP. Therefore, the side or bottom surface of the package cannot be directly attached onto a separate PCB or ceramic substrate during a hot bar process performed for manufacturing a socket-type camera module, and thus a separate contact must be interposed therebetween for electrical connection of the package.

SUMMARY OF THE INVENTION

An advantage of the present invention is that it provides a method of manufacturing a WLCSP of an image sensor. In the method, a glass is attached onto an air cavity forming surface in a wafer level stage. A wafer is etched to thin an opposite surface of the wafer, long via holes are formed on a wafer surface, and the long via holes are filled with metal. The wafer is again etched such that only a metal portion protrudes, thereby completing a CSP. Accordingly, it is possible to satisfy the component requirements for an ultra-thin electronic package and to apply a batch process.

The present invention also provides a WLCSP of an image sensor in which metal bumps are formed on the both etched sides of the wafer such that they protrude beyond the surface of the wafer. The metal bumps serve as the conventional solder balls. Accordingly, as the conventional process for attaching the conventional solder balls can be omitted, the productivity of the WLCSP can be enhanced greatly.

Additional aspect and advantages of the present general inventive concept will be set forth in part in the description which follows and, in part, will be obvious from the description, or may be learned by practice of the general inventive concept.

According to an aspect of the invention, a WLCSP of an image sensor includes: a wafer having an image sensor disposed on the top surface thereof and pads disposed on the both sides of the image sensor; glass whose both edge portions are supported by and attached onto support members; and metal bumps electrically connected to the pads and formed to protrude beyond the bottom surface of the wafer.

The wafer is thinned to a minimum possible thickness, the image sensor is formed in the center region of the top surface of the wafer, and the support members are formed of hardened resin containing spacers so as to protect the pads provided in both sides thereof.

The glass may be an IR filter glass capable of serving as an IR filter. The glass is attached to the top surface of the wafer such that an air cavity is formed over a microlens unit. Alternatively, the glass may be attached using a transparent adhesive without forming the air cavity.

An adhesive used to attach the glass onto the wafer (i.e., a resin constituting the support members) is preferably an epoxy-based adhesive, a silicon-based adhesive, a benzocyclobutene (BCB) adhesive, or a UV-curable resin that is low in gas discharge.

The adhesive contains spacers for protecting the pads and a high-adhesive material that is low in thermal expansion and moisture absorption.

The metal bump is formed at an etched portion of the wafer by an electro copper plating (ECP) process or a process of printing and hardening conductive paste, such that it is electrically connected to an exposed portion of the pad.

According to another aspect of the invention, a method of manufacturing a WLCSP of an image sensor includes: forming an image sensor on a wafer level and attaching a glass thereon to provide a cavity; performing a thinning process to thin a bottom surface of the wafer; performing an etching process such that long via holes are formed at an opposite surface of the glass attaching surface of the wafer; filling the long via holes with conductive paste to form the conductive line; etching the wafer except the metal filling the long via holes such that meta bumps are protruded; and dicing the resulting wafer-level package into separate packages.

In the thinning process, the bottom surface of the wafer is thinned to a thickness of 100 μm or less so at to slim a package.

In the etching process, a dry etching process or a wet etching process is performed on the wafer to form the long via holes. In the dry etching process, a photolithography process is performed to form a resist layer and a DRIE process is performed to open only an etch target portion.

In the wet etching process, a Si3N4 epitaxial layer is grown on the bottom surface of the wafer corresponding to the pads and the resulting structure is etched using a KOH etchant. By the etching of the wafer, the wall surface of the long via hole is formed at a right or slant angle in the shape of a tapered surface.

The forming of the conductive lines using the metal includes: a paste injection process for printing conductive or solder paste on a wafer surface and hardening the printed paste through reflow; and a plating process for forming a seed layer, performing copper plating; and planarizing the plated surface by CMP to form the conductive lines.

After the metal filling the long via holes is electrically connected to the respective pads, the wafer surface except the portion filled with the metal is again etched such that the metal protrudes to a thickness of several μm from the wafer surface and serves as a bump pad.

Thereafter, the metal portion filling the long via holes is diced along its central line into separate packages with metal bumps formed on their both sides.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a sectional view of a conventional crystal substrate device with an internal cavity;

FIG. 2 is a sectional view of a WLCSP according to an embodiment of the present invention; and FIGS. 3 to 9 illustrate sequential processes for manufacturing a WLCSP according to an embodiment of the present invention, wherein FIG. 3 is a sectional view illustrating a process of printing resin onto a wafer;

FIG. 4 is a sectional view illustrating a process of attaching glass onto the wafer;

FIG. 5 is a sectional view illustrating a process of thinning the wafer;

FIGS. 6A and 6B are respectively a sectional view and a plan view that illustrate a process of etching the wafer;

FIGS. 7A and 7B are respectively a sectional view and a plan view that illustrate a process of performing a metal printing operation for filling the etched portion of the wafer with metal;

FIGS. 8A and 8B are respectively a sectional view and a plan view that illustrate a process of selectively etching the surface of the wafer;

FIGS. 9A and 9B are respectively a sectional view and a plan view that illustrate a final dicing process; and FIGS. 10A and 10B are respectively a top plan view and a bottom plan view that illustrate the shape of the wafer-level package before the final dicing process.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, preferred embodiments of the present invention will be described in detail with reference to the accompanying drawings.

Structure of WLCSP

FIG. 2 is a sectional view of a WLCSP according to an embodiment of the present invention.

Referring to FIG. 2, a WLCSP of an image sensor according to the present invention includes a wafer 10, an image sensor 11, an air cavity 12, and a pair of pads 13. The image sensor 11 and the air cavity 12 are formed at a central portion of the top surface of the wafer 10, and the pair of pads 13 are disposed respectively on both sides of the image sensor 11. Glass 20 is attached onto the top of the image sensor 11 such that it covers the entire top surface of the wafer 10. A pair of metal bumps 30 are formed on the both sides of the wafer 10 such that they form conductive lines for the pads 13.

The wafer 10 is formed of silicon. The image sensor 11 may include a microlens. Support members 14 are formed on the pads 12 such that they support the both bottom sides of the glass 20.

The support members 14 may be formed in a dam shape by a photolithography process using photosensitive resin. The support members 14 are formed to a predetermined height such that it can maintain a space for forming the air cavity 12 between the top surface of the image sensor 11 and the bottom surface of the glass 20.

When photosensitive resin (sealant) containing spacers are printed or dispensed to attach the support members 14 onto the glass 20, the spacers are impregnated into the sealant such that the glass 20 is spaced apart from the image sensor 11 by a predetermined distance. At this point, the size of the spacer may be adjusted according to circumstances.

The sealant is preferably formed of a high-adhesive material that is low in thermal expansion and moisture absorption. The sealant is preferably hardened using ultraviolet (UV), heat, or a hybrid thereof (i.e., UV+heat).

The pads 13 may be general-size pads or extension pads.

The glass 20 may be attached directly to the support members 14 when the support members 14 are hardened.

Alternatively, the top surfaces of the support members 14 may be coated with a separate adhesive to attach the glass 20 to the support members 14. Preferably, the separate adhesive is an epoxy-based adhesive, a silicon-based adhesive, a benzocyclobutene (BCB) adhesive, or a UV-curable resin that is low in gas discharge during the hardening of the support members 14.

The glass 20 may be an infrared (IR) filter glass capable of serving as an IR filter.

The wafer 10 is formed to a small thickness of 100 μm or less by a thinning process at the initial stage of a packing process. The metal bumps 30 are formed on the both sides of the wafer 10 in such a way that they protrude beyond the bottom surface of the wafer 10.

The metal bumps 30 are formed using a metal plating method or a hardening method in which a conductive paste is injected into a long via hole formed during an initial etching process for the silicon wafer 10. The metal bumps 30 is electrically connected to a portion of the pad 13 that is exposed by an etching process, thereby forming a conductive line.

At this point, the metal bump 30 forms a conductive line with respect to the pad 13. In addition, the metal bump 30 protrudes beyond the bottom surface of the wafer 10 such that it contacts directly onto an electrical assembly formed on the bottom surface of the wafer 10. Accordingly, the bottom side of the protruding portion of the metal bump 30 can be directly and safely seated onto a socket-type camera module.

As described above, since the conventional WLCSP has a protruding ball-type bump, a separate PCB or ceramic substrate must be used to attach a socket-type camera module to the bottom or side surface of the conventional WLCSP. On the contrary, the metal bumps 30 of the WLCSP according to the present invention protrude beyond the bottom surface of the wafer 10 merely by a difference of several μm and thus can be directly attached to a socket-type camera module. This makes it possible to simplify a camera module manufacturing process, reduce the number of necessary assembly components, and reduce the manufacturing costs.

The WLCSP of the image sensor according to the present invention is manufactured through sequential processes of printing resin at regular intervals over the wafer having the image sensor provided thereon; attaching the glass to provide the air cavity; performing a thinning process to thin the bottom surface of the wafer; performing an etching process such that the long via hole is formed at an opposite surface of the glass attaching surface of the wafer; filling the long via hole with conductive paste to form the conductive line; etching the wafer except the metal filling the long via hole such that the meta bump is protruded; and dicing the resulting wafer-level package into separate chip-scale packages.

The sequentially processes for manufacturing the WLCSP will be described below in detail with reference to FIGS. 3 to 9.

Method of Manufacturing WLCSP

FIGS. 3 to 9 illustrate sequential processes for manufacturing a WLCSP according to an embodiment of the present invention.

FIG. 3 is a sectional view illustrating a process of printing resin onto a wafer.

Referring to FIG. 3, image sensors 11 is formed on a wafer 10, and an air cavity 12 is formed on the image sensors 11. Elongated pads 13 are formed at regular intervals on both sides of scribe lines that are disposed on both sides of each image sensor 11.

The scribe lines are used as dicing lines in a final dicing process.

Dam-shaped support members 14 are formed on the pads 13 such that the air cavity 12 is formed on the wafer 10. The support members 14 are formed of resin containing spacers. The support members 14 are formed in the shape of patterns with a predetermined height by a photolithography process after photosensitive resin is deposited thereon.

The patterns of the supports members 14 may be formed by depositing photosensitive resin and depositing a separate adhesive on the resulting structure. Alternatively, the patterns of the supports members 14 may be formed using BSB resin without using a separate adhesive.

FIG. 4 is a sectional view illustrating a process of attaching glass onto the wafer.

Referring to FIG. 4, the glass 20 is seated on the resulting structure such that the glass 20 is contacts the support members 14. Thereafter, the support members 14 are completely hardened to attach the glass 20 onto the resulting structure.

The resin forming the support members 14 may be hardened using UV, heat, or a hybrid thereof (i.e., UV+heat). By the attachment of the glass 20, an air cavity 12 is formed between the glass 20 and the image sensor 11 to the height of the support member 14 formed on the pad 13.

FIG. 5 is a sectional view illustrating a process of thinning the wafer 10.

Referring to FIG. 5, the wafer 10, which is generally formed of silicon to a thickness "h" of 750 μm, is thinned to a thickness of 100 μm or less.

This is done to slim the WLCSP and to easily form metal bumps on both sides of the wafer 10 in a subsequent process.

A resist layer (not illustrated) may be formed in order to perform a wet etching operation in a subsequent etching process. The resist layer may be formed by an $Si_3N_4$ epitaxial growth layer using a low-pressure chemical vapor deposition (LPCVD) device.

FIGS. 6A and 6B are respectively a sectional view and a plan view that illustrate a process of etching the wafer 10.

Referring to FIGS. 6A and 6B, if a resist layer was formed in the thinning process, only etch target portions of the resist layer are opened and dry-etched using a dry reactive ion etching (DRIE) process, thereby forming long via holes 16.

Alternatively, a wet etching process using an etchant may be performed on the wafer 10 to form the long via holes 16, wherein a wet etching process is performed on portions where long via hole type resist patterns are not formed by the $Si_3N_4$ epitaxial growth layer.

The etchant for the wet etching process may be 70-90° C. 40% KOH, the etching area of the wafer 10 may be about 600 μm², and the etching depth of the wafer 10 may be about 90-10 μm. These etching conditions for the wafer 10 may vary depending on the shape and kind of the wafer 10.

For example, the etching characteristics of the wafer 10 are determined according to the material of the wafer 10, the kind, concentration and temperature of the etchant, and so on. The etching rate of the wafer 10 can be increased or decreased by adjusting the kind, concentration and temperature of the etchant.

In the case of a silicon wafer, both monocrystalline silicon and polycrystalline silicon are generally wet-etched using a mixture of HNO3 and 6HF. There is also an etchant that exhibits etching characteristics depending on silicon orientation (crystal direction). An example of the silicon orientation dependent etchant is a mixture of KOH and Isopropyl alcohol.

By the wet etching process or the dry etching process, the long via hole 16 has an etched wall surface that is formed in the shape of a tapered slant surface.

As described above, a metal paste is injected into the long via hole 16 of the wafer 10 to form a conductive line with respect to the pad 13. In case where the both sides of the long via hole 16 are formed at a right angle, it is difficult to form the conductive line that is good for the pad 13. Therefore, it is preferable that the both sides of the long via hole 16 are formed with tapered slant surfaces.

However, in case where a process of plating metal was used instead of a process of injecting metal paste through the long via hole 16 of the wafer 10, an excellent conductive line can be formed using an uniform filling process even though the both sides of the long via hole 16 have been formed at a right angle. Therefore, the present invention is not limited to the case where the both sides of the long via hole 16 is formed at a slant angle.

FIGS. 7A and 7B are respectively a sectional view and a plan view that illustrate a process of performing a metal printing operation for filling the etched portion of the wafer 10 with metal.

Referring to FIGS. 7A and 7B, the long via holes 16, which have been formed at regular intervals on the wafer 10, is filled with metal paste 30. The metal paste 30 is electrically connected to the patterned pads 13 located between the image sensor 11 and the glass 20, thereby forming desired conductive lines.

The filling of the long via hole 16 with the metal paste 30 is performed by a process of printing conductive paste including solder paste or by a process of plating metal.

The conductive paste printing process includes: printing the conductive paste such that the conductive paste is injected into the long via hole 16; and hardening the injected conductive paste through an oven or reflow. The metal plating process includes: depositing seed metal; performing copper plating; and performing chemical mechanical planarization (CMP) such that only the metal filling the long vial hole 16 remains.

Thereafter, the hardened metal portion 30 is planarized with respect to the top surface of the wafer 10.

FIGS. 8A and 8B are respectively a sectional view and a plan view that illustrate a process of selectively etching the surface of the wafer 10.

As shown in FIGS. 8A and 8B, only the wafer 10 and the hardened metal portion 30 are located on the bottom surface of the package. Under the above wafer etching conditions, only the wafer 10 is etched by several to several tens μm such that the hardened metal portion 30 protrudes over the surface of the wafer 10.

At this point, it is preferable that the hardened metal portion 30 protruding over the surface of the wafer 10 is plated with high-conductivity material such as copper (Cu), Nickel (Ni), aurum (Au) such that it forms a pillar-shaped electrode.

FIGS. 9A and 9B are respectively a sectional view and a plan view that illustrate a final dicing process.

Referring to FIGS. 9A and 9B, the resulting wafer-level package is diced into separate WLCSPs using the center line of the protruded, hardened metal portion 30 (i.e., a scribe line between the pads 13) as a dicing line. In the separate WLCSP, a pair of metal bumps 30 are formed on the both sides of the wafer 10 such that they protrude beyond the bottom surface of the wafer 10 and form conductive lines with respect to the pads 13 on the wafer 10.

FIGS. 10A and 10B are respectively a top plan view and a bottom plan view that illustrate the shape of the wafer-level package before the final dicing process.

Referring to FIGS. 10A and 10B, a plurality of packages are formed at regular intervals on a disk-type silicon wafer. Thereafter, the resulting wafer-level package is diced along dicing lines formed on the central lines of the packages, thereby completing separate rectangular WLCSPs.

In the WLCSP of the present invention as described above, the wafer with the image sensor formed thereon is formed thinly. The metal bumps are formed on the both sides of the wafer such that they directly contact the pads on the wafer and protrude beyond the bottom surface of the wafer. Therefore, the package can be directly attached to the camera module even without using a separate PCB or ceramic substrate. Accordingly, the module assembly space can be reduced to miniaturize the product. Also, the substrate manufacturing costs can be reduced to lower the unit price of the product.

In addition, the metal bumps serve as conventional solder balls, thereby making it possible to omit a conventional redistribution line forming process for forming a conductive line between the solder balls. Accordingly, the number of processes for manufacturing the package can be reduced to reduce the manufacturing time, thereby enhancing the mass-production capability.

Furthermore, because the glass is directly attached in the wafer level stage of the WLCSP, the defects due to foreign substances can be minimized.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A wafer-level chip-scale package (WLCSP) of an image sensor, comprising:
    a wafer having an image sensor and a pair of pads disposed thereon, a portion of the bottom surface of the image sensor being exposed outward from the both ends of the wafer;
    support members disposed on the pads to support the both bottom sides of glass, the support members being formed to a predetermined thickness to provide a space for forming an air cavity;
    the glass safely seated on the support members such that the air cavity is formed on the wafer; and
    pillar-shaped metal bumps disposed on the both sides of the wafer corresponding to the pads such that the bottom surfaces of the metal bumps protrude beyond the bottom surface of the wafer and contact directly with the pad such that the metal bumps form conductive lines electrically connected to the pads.

2. The WLCSP according to claim 1, wherein the wafer is formed to a thickness of 100 μm or less.

3. The WLCSP according to claim 1, wherein the pads are formed of extension pads or pads having such a size as to cover the support members.

4. The WLCSP according to claim 1, wherein the support members are formed of one of epoxy-based resin, silicon-based resin, benzocyclobutene (BCB)-based resin, and UV-curable resin that is low in gas discharge.

5. The WLCSP according to claim 1, wherein the metal bumps are plated with one of copper (Cu), Nickel (Ni), and aurum (Au).

6. The WLCSP according to claim 1, wherein the wafer is formed to a thickness of 100 μm or less, and
    the pads are formed of extension pads or pads having such a size as to cover the support members.

7. The WLCSP according to claim 6, wherein the support members are formed of one of epoxy-based resin, silicon-based resin, benzocyclobutene (BCB)-based resin, and UV-curable resin that is low in gas discharge.

8. The WLCSP according to claim 7, wherein the metal bumps are plated with one of copper (Cu), Nickel (Ni), and aurum (Au).

* * * * *